United States Patent [19]

Robinton et al.

[11] Patent Number: 4,542,354

[45] Date of Patent: Sep. 17, 1985

[54] DELTA-SIGMA PULSE MODULATOR WITH OFFSET COMPENSATION

[75] Inventors: Michael A. Robinton, Palo Alto; Alan H. Starkie, San Jose, both of Calif.

[73] Assignee: Robinton Products, Inc., Sunnyvale, Calif.

[21] Appl. No.: 518,820

[22] Filed: Aug. 1, 1983

[51] Int. Cl.[4] ..................... H03K 13/03; H03K 13/22
[52] U.S. Cl. ..................... 332/11 D; 330/9; 340/347 AD; 340/347 CC; 375/29; 375/34
[58] Field of Search ............ 332/9 R, 9 T, 11 R, 332/11 D; 375/22, 23, 27, 28, 29, 34; 340/347 AD, 347 CC; 324/142; 330/9

[56] References Cited

U.S. PATENT DOCUMENTS

| | | | |
|---|---|---|---|
| 3,281,827 | 10/1966 | Olshausen et al. | 340/347 |
| 3,461,406 | 8/1969 | Kroll | 332/11 D |
| 3,488,652 | 1/1970 | Huelsman | 340/347 |
| 3,500,109 | 3/1970 | Sugiyama et al. | 324/99 |
| 3,859,654 | 1/1975 | Harrison et al. | 340/347 AD |
| 3,875,508 | 4/1975 | Milkovic | 324/142 |
| 3,875,509 | 4/1975 | Milkovic | 324/142 |
| 3,895,376 | 7/1975 | Uchida | 340/347 CC |
| 3,934,198 | 1/1976 | Milkovic | 324/142 |
| 3,942,110 | 3/1976 | Milkovic | 324/142 |
| 3,942,172 | 3/1976 | Tucker | 340/347 NT |
| 3,955,138 | 5/1976 | Milkovic | 324/107 |
| 3,961,257 | 6/1976 | Milkovic | 324/142 |
| 3,975,682 | 8/1976 | Mayfield | 324/142 |
| 4,031,532 | 6/1977 | First | 340/347 NT |
| 4,058,768 | 11/1977 | Milkovic | 324/142 |
| 4,074,194 | 2/1978 | Wilkerson | 324/142 |
| 4,182,983 | 1/1980 | Heinrich et al. | 324/142 |
| 4,217,546 | 8/1980 | Milkovic | 324/142 |
| 4,275,349 | 6/1981 | Wintermute | 324/141 |
| 4,291,300 | 9/1981 | Bader | 340/347 AD |
| 4,315,212 | 2/1982 | Gamoh | 324/142 |
| 4,315,254 | 2/1982 | Honjyo et al. | 340/347 M X |
| 4,322,687 | 3/1982 | Dwarakanath et al. | 330/9 |
| 4,417,160 | 11/1983 | Schade, Jr. | 330/9 |

OTHER PUBLICATIONS

Inose et al., "A Unity Bit Coding Method by Negative Feedback", Proceedings of the IEEE, Nov. 1963, pp. 1524-1535.

Friedl et al., "Electronic Three-Phase Four-Wire Power-Frequency Converter with High Accuracy Over a Wide Range of Use", IEEE Transactions on Instrumentation and Measurements, vol. IM-20, No. 4, Nov. 1971, pp. 308-312.

Primary Examiner—Siegfried H. Grimm
Attorney, Agent, or Firm—Philip A. Girard

[57] ABSTRACT

A modulator is provided for converting an analog input to an output pulse train having an average amplitude proportional to the input signal. The modulator circuit employs delta-minus-sigma modulation in which the output pulse train controls the selection of reference signals which exactly balance the input signal, over time. Instantaneous differences between the reference signals and the input signal are accumulated and measured by an integrator/comparator circuit. A high level of accuracy is achieved in the integrator/comparator because the system employs offset compensation to correct for voltage offset in one or more of the operational amplifiers. Several embodiments of the offset compensation system are disclosed. A method of modulation is also disclosed.

16 Claims, 11 Drawing Figures

DELTA-SIGMA PULSE MODULATOR WITH OFFSET COMPENSATION

BACKGROUND OF THE INVENTION

This invention relates generally to modulators and modulation methods of the type which convert an analog input to an output pulse train having an average amplitude over time proportional to the analog input.

Circuits for producing modulated pulse train outputs proportional to an analog input have numerous applications. Where high accuracy and a wide dynamic range are required, such as in electrical power metering, it is desirable to employ delta-minus-sigma modulation. Delta-minus-sigma modulation has long been known; see, for example Inose et al., "A Unit Bit Coding Method By Negative Feedback", Proceedings of the IEEE, November, 1963, page 1524. Such modulation employs feedback of the output pulse train, or reference voltages or currents controlled by the output pulse train, to a summing node to which the input signal is also supplied. The difference between the two signals is integrated and compared to a predetermined reference level. When the reference level is crossed, a gate is opened or closed, either beginning or terminating an output pulse and simultaneously changing the signal being fed back to the summing node. The integrated signal is thus always maintained in the vicinity of the reference level and, assuming an input signal varying sufficiently slower than the output pulses, the output pulse train will carry information reflecting the input amplitude to a high degree of accuracy.

For the above system to operate over a wide dynamic range, particularly at low input amplitudes, the measuring circuit internal components must be relatively free of errors. One specific problem is that amplifier circuitry generally has internal voltage offsets which must be compensated. The term voltage offset is generally defined as the voltage difference between the inputs of an active circuit element, such as an operational amplifier, when the output is at zero. Ideally, the voltage offset will be zero. When it is not, offset can easily be corrected for, once its value is known. Offset measurement and corrective calibration are expensive, however, as is the use of low error components, so manufacturers of equipment requiring high accuracy analog modulators generally resort to "zeroing out" strategems.

It would be advantageous to provide a modulator for converting an input signal to a pulse train which has an average amplitude proportional to the magnitude of the input signal, and which has both high accuracy, and a wide dynamic range. It would be particularly advantageous if such a circuit would automatically compensate for internal voltage offsets without the need for expensive calibration or the use of error-free components.

SUMMARY OF THE INVENTION

The present invention provides a modulator for converting an input signal to an output pulse train which varies between two levels and which has an average level over time proportional to the input signal. The modulator includes a summing node and means for supplying the input signal to the summing node. A switch means selects between at least two different reference signals having predetermined magnitudes to provide a second signal to the summing node. The difference at any time between the input signal and the second signal is defined as a difference signal. The difference signal is measured by a measuring means which integrates the difference signal at the summing node and determines when the integrated difference signal reaches a threshold level. The measuring means includes an amplifier element and also includes offset compensation means for substantially eliminating any offset errors resulting from a voltage offset existing between the amplifier inputs. The compensation means includes a first storage element connected to one of the amplifier inputs and means for transferring an offsetting voltage to the first storage element, to compensate for the voltage offset. A clock is provided for producing clock pulses at predetermined clock intervals. A bistable circuit, responsive to the measuring means and the clock, produces a first output signal which is changeable at each clock pulse between first and second levels, whenever the integrated difference signal has crossed the threshold level during a clock interval. The switch means for selecting between the at least two different reference signals is responsive to the bistable circuit, such that one of the reference signals is supplied to the summing node when the first output signal is at its first level and another reference signal is supplied to the summing node when the first output signal is at its second level. The average level of the reference signals supplied by the switch means over time balances the input signal at the summing node. The average level over time of the first output signal, which represents the output of the modulator, is, likewise, proportional to the input signal.

In the preferred embodiment of the invention, described below, several alternative techniques are suggested for storing the offsetting voltage on a capacitor, or other storage element, connected to one of the amplifier inputs to produce offset compensation. Alternative forms of the measuring means are also set forth.

The present invention further encompasses a method of converting an input signal to an output pulse train which varies between two levels and which has an average level over time proportional to the input signal. A first step in the method is to supply the input signal to a summing node. A second signal is then supplied to the summing node, the second signal being selected from at least two different reference signals, having predetermined magnitudes. The difference at any time between the input signal and the second signal is defined as a difference signal. The difference signal is measured in a measuring step, which includes integrating the difference signal and comparing the integrated difference signal against a threshold level. The measuring step includes the use of at least one amplifier element, and includes the step of compensating for any voltage offset between the inputs of the amplifier element by transferring an offsetting voltage to a first storage element connected to one input of the amplifier element. The compensating step assures that the measurement of the difference signal at the summing node is highly accurate. The method outputs a first output signal changeable at predetermined clock intervals between first and second levels whenever the integrated difference signal crosses the threshold, in the measuring step, during a clock interval. The step of selecting the second signal is accomplished in response to the first output signal, such that one of the reference signals is supplied to the summing node when the first output signal is at its first level and another reference signal is supplied to the summing node when the first output signal is at its second level. In the method, the average value of the reference signals over time balances the input signal at the summing node. As a result, the average level over time of the first output signal is proportional to the input signal.

Several embodiments of the method are set forth below, including various embodiments of the measuring step and the compensating step for compensating for voltage offset in the amplifier element.

A BRIEF DESCRIPTION OF THE DRAWINGS

DESCRIPTION OF THE PREFERRED EMBODIMENT

Figure 1:
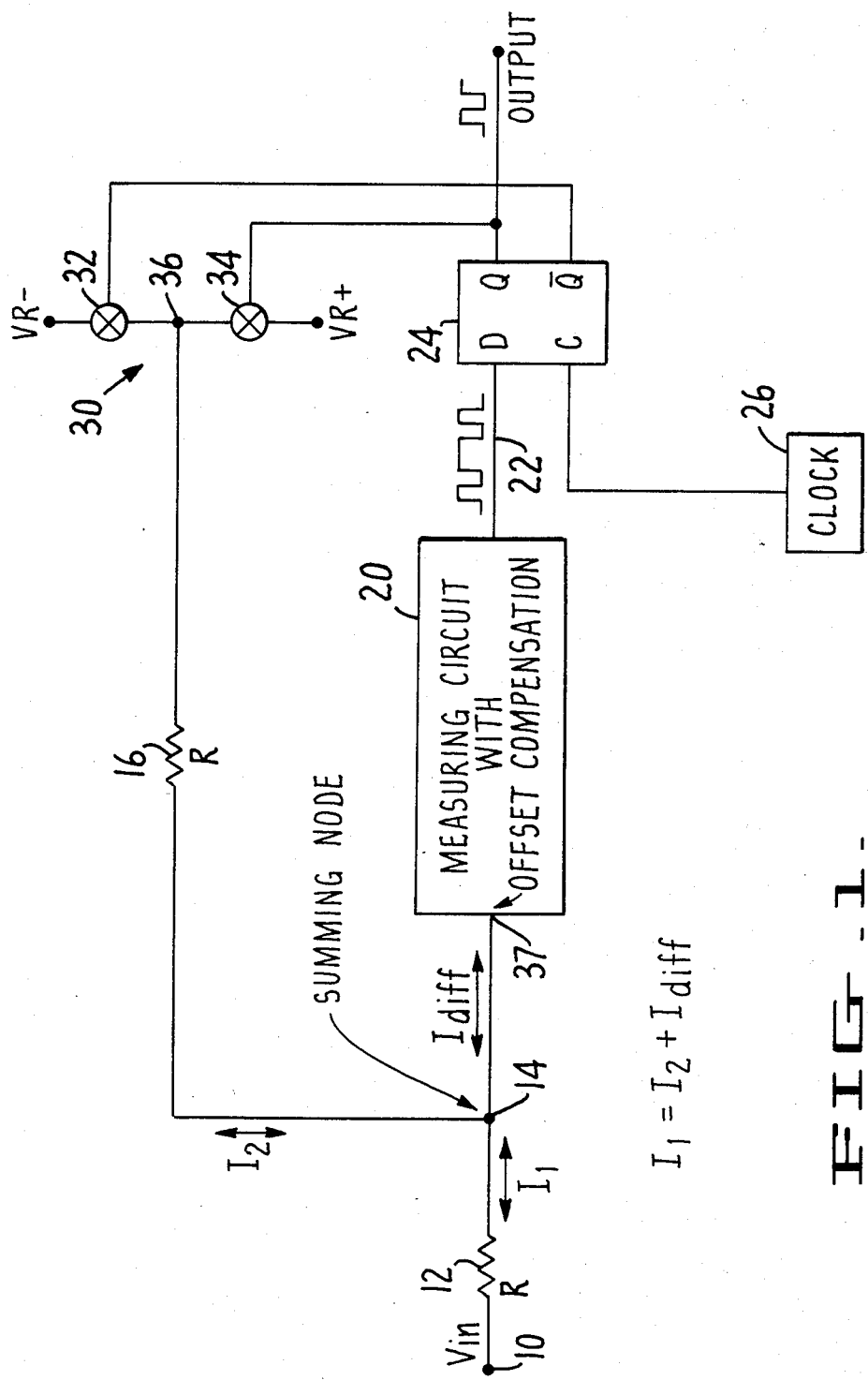
FIG. 1 is a schematic block diagram of a modulator as used in the present invention.

Referring to FIG. 1, a modulator according to the present invention is schematically illustrated. An analog input signal, as represented by input voltage $V_{in}$, is supplied through an input point 10 and input resistor 12 to a summing node 14. The signal to summing node 14 from input 10 can be conveniently represented by the current $I_1$, which either moves into or out of summing node 14 through resistor 12, depending on the polarity of $V_{in}$.

The second signal supplied to summing node 14 is represented by $I_2$, which is provided by one of two reference voltages through resistor 16. In the preferred embodiment, the reference voltages are substantially equal in value and opposite in polarity and are represented by $VR+$ and $VR-$. As will be explained more fully below, either $VR+$ or $VR-$ is connected to summing node 14 through resistance 16 at all times. The present invention provides that $I_1$ and $I_2$, into summing node 14, must balance over time. Instantaneous differences between $I_1$ and $I_2$ are represented by $I_{diff}$. Since the total charge entering and leaving summing node 14 must always balance, the relationship between $I_1$, $I_2$ and $I_{diff}$ can be represented by the equation $I_1 = I_2 + I_{diff}$.

Box 20 represents a measuring means or circuit for both integrating the difference signal $I_{diff}$ at summing node 14 and for determining when the integrated difference signal reaches a threshold level. In general, measuring circuit 20 can be described as an integrator and comparator. The output of measuring circuit 20 is a first control signal changeable between two different levels in response to a crossing of a threshold in measuring circuit 20 by the integrated difference signal. For example, the first control signal on line 22 will be low when the integrated difference signal is above the threshold level and high when the integrated difference signal is below the threshold level.

The output of measuring circuit 20 is supplied on line 22 to the D input of bistable circuit 24. The output of bistable circuit 24 includes a Q output, referred to herein as the first output signal. Q is changeable between first and second levels upon receipt of clock pulses which occur at predetermined clock intervals supplied by clock 26, which can be a conventional oscillator. In addition to the Q output, bistable circuit 24 supplies a $\overline{Q}$ output which is low when Q is high, and vice versa. The Q and $\overline{Q}$ outputs of bistable circuit 24 together control switch means 30 for selecting the reference signal to be supplied to summing node 14. In the preferred embodiment, a pair of switches 32 and 34 connect negative and positive reference voltages, $VR-$ and $VR+$, respectively, to point 36. When Q is high, $VR+$ is connected to point 36 and a positive reference signal supplies current to summing node 14. When Q is low, $\overline{Q}$ is high and a negative reference signal is supplied, and current is drawn from summing node 14.

Several embodiments of measuring circuit 20, which include different types of integrators and comparators suitable for use with the present invention, will be described below. Each embodiment functions broadly as a delta-minus-sigma convertor. In each example, the integration and comparison of $I_{diff}$ to produce the first control signal on line 22 must be relatively error-free. In particular, that requires elimination or correction for any voltage offset existing between the input terminals of the operational amplifiers in measuring circuit 20. Examples of the offset compensation system of the present invention are set forth below, and all include at least one input to an active circuit element, such as an operational amplifier, at which the offset error is eliminated. Input 37 to measuring circuit 20 schematically represents the offset compensated input to an active circuit element.

Figure 2:
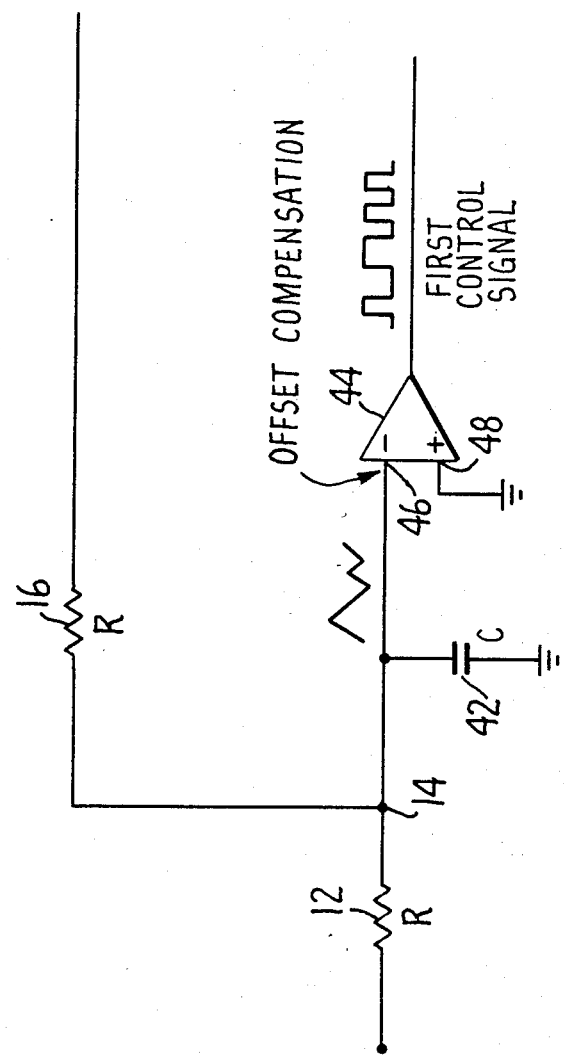
FIG. 2 is a schematic diagram showing one form of the measuring circuit of the present invention.

One example of an integrator/comparator circuit which serves as measuring circuit 20 is shown in FIG. 2. For simplicity, the circuit and its operation will first be described without reference to offset compensation, other than to indicate, in FIG. 2, where offset compensation is necessary to achieve wide dynamic range. In this example, measuring circuit 20 consists of a storage element such as capacitor 42 connected between summing node 14 and a common ground. Together with impedances 12 and 16, capacitor 42 forms a conventional RC circuit, with the voltage at summing node 14 being the integrated difference signal which is supplied to comparator 44. The voltage at summing node 14 is supplied to the inverting input 46 of comparator 44. The non-inverting input 48 is connected to ground.

Figure 3:
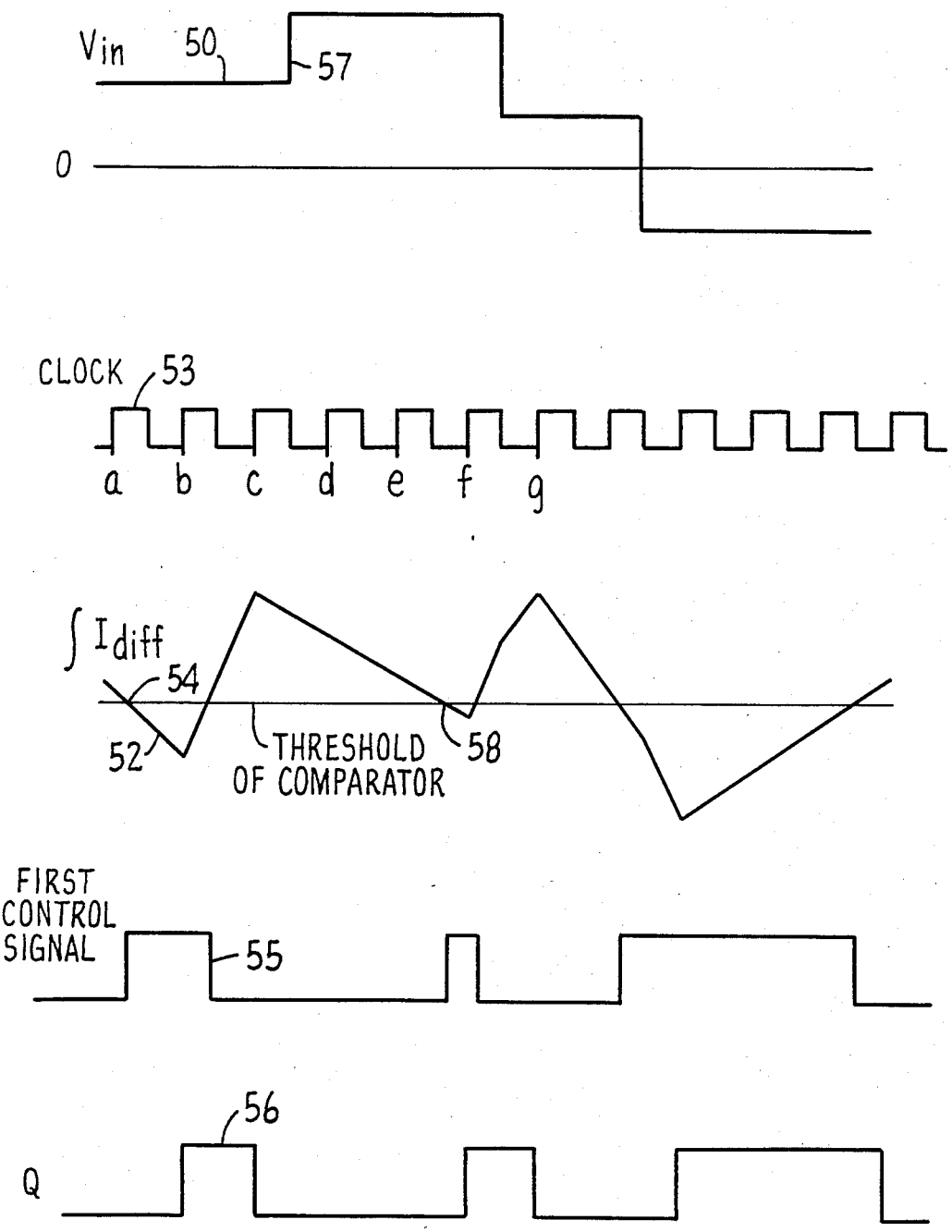
FIG. 3 is a set of graphic traces representing various waveforms associated with the modulator of the present invention.

FIG. 3 illustrates several of the signals produced by the circuit of FIGS. 1 and 2, assuming a zero or fully compensated voltage offset in comparator 44. Input signal $V_{in}$ is represented by line 50. Initially, switch 32 is assumed to be closed, and a negative reference current is applied to summing node 14 through resistor 16. The values of VR− and resistor 16 are chosen to produce a current $I_2$ which is large relative to input signal $I_1$. $I_{diff}$ will therefore have a net negative value, with current being drawn from capacitor 42. Consequently, the integrated difference signal $I_{diff}$ initially decreases, as shown in line 52.

Clock 26 outputs signal 53. Bistable circuit 24 clocks on the leading edge of each upwardly-moving pulse. At clock pulse a, ∫ $I_{diff}$ has not yet crossed the threshold of comparator 44, so Q remains low and $\overline{Q}$ high and $I_{diff}$ continues to integrate downward. Since ∫ $I_{diff}$ is supplied to the inverting input of comparator 44, when ∫ $I_{diff}$ crosses the threshold, at 54, the comparator output switches from low to high. First control signal 55 represents the output of comparator 44. Consequently, at clock pulse b, bistable circuit 24 will change states and Q will go from low to high (line 56). When Q goes high $\overline{Q}$ goes low and switch 34 is closed and switch 32 is open. A positive reference signal is then supplied to summing node 14, causing integrated $I_{diff}$ to increase until the next clock pulse at c. Between clock pulses b and c, integrated $I_{diff}$ again crosses the threshold level of comparator 44, causing first control signal 55 to go low. Q then goes low at the next clock pulse, causing the reference signal supplied to summing node 14 to again go negative. As $V_{in}$ increases, at 57, the slope of $I_{diff}$ changes and its value decreases until again crossing the threshold level. Q remains low until detecting a change is the first control signal at clock pulse f. Q then goes high, again switching the reference signal from negative to positive.

The above-described circuit and method operates as a delta minus sigma convertor in which only the difference between the input and reference signals is integrated and measured. The circuit always maintains the integrated difference signal ∫ $I_{diff}$ around the threshold level of comparator 44. The Q output of bistable circuit 24 is chosen as the first output signal, having an average level or amplitude over time which is equal in magnitude to $V_{in}$.

Figure 4:
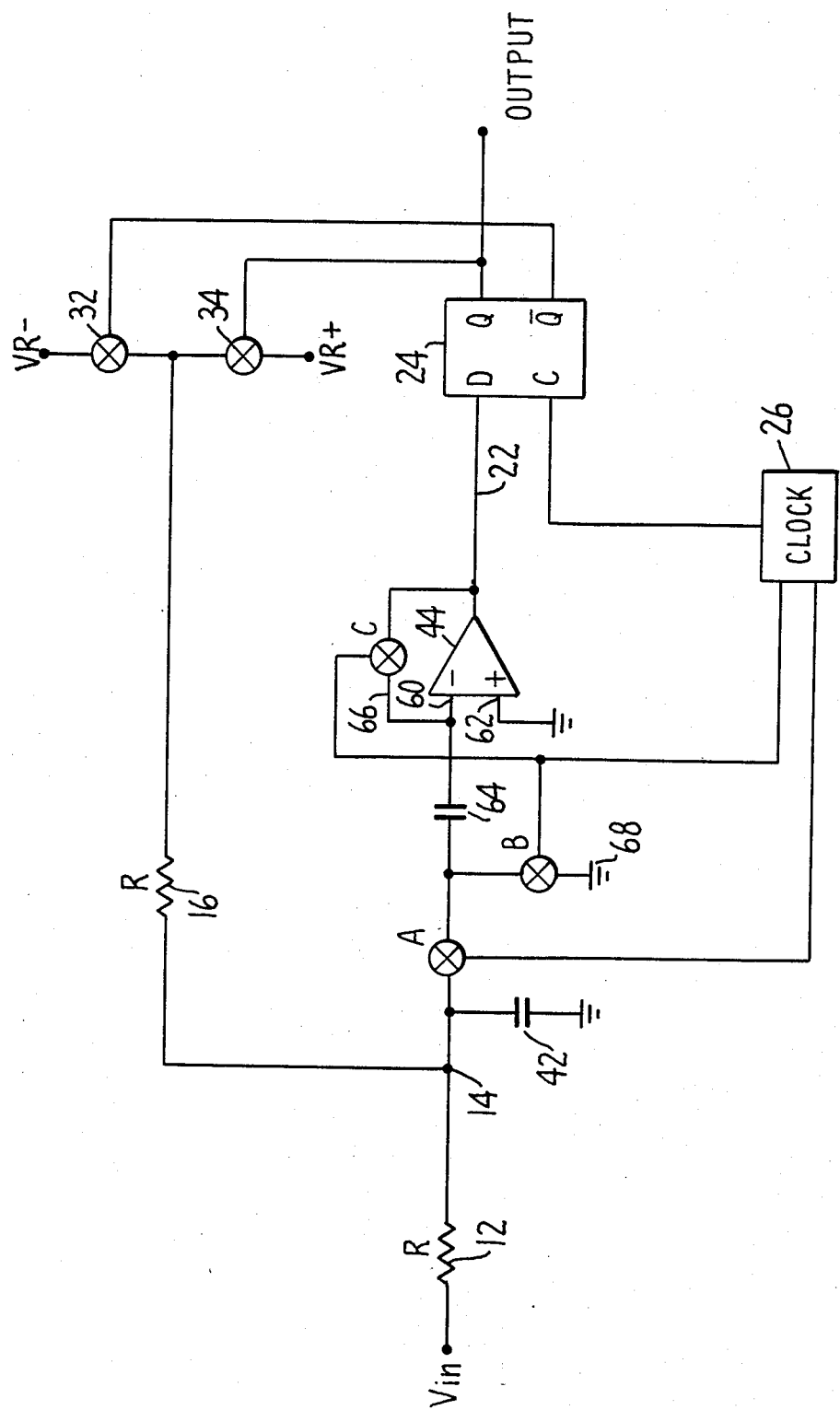
FIG. 4 is a schematic circuit diagram of the embodiment of the modulator of the present invention shown in FIG. 2, showing one embodiment of the offset compensation system of the present invention.

FIG. 4 shows a modulator circuit as in FIGS. 1 and 2 which incorporates one embodiment of an offset compensation system according to the present invention. Reference numbers used in FIG. 4, and subsequent figures, are the same as in FIGS. 1 and 2, for identical elements. In this embodiment, comparator 44, which is an operational amplifier element, is provided with compensating means for substantially eliminating any offset error resulting from a voltage offset existing between the amplifier inputs 60 and 62. As described above, a voltage offset is generally defined as the voltage required between inputs of an amplifier to produce a zero output. Ideally, voltage offset is zero, but in most real-world operational amplifiers an offset of unknown value is usually present. With the present invention, a first storage element, such as capacitor 64, is connected to one of the amplifier inputs, and an offsetting voltage substantially equal to the voltage offset of the amplifier is stored on the storage element to compensate for the voltage offset. In the example shown in FIG. 4, capacitor 64 is located in the electrical path between summing node 14 and inverting amplifier input 60. It should be understood that capacitor 64, like capacitor 42 and the other storage elements used in the embodiments described below, represent one type of storage element which can be used, and that other types of circuit elements, such as registers with D to A convertors and the like, could be used for the various storage elements of the present invention.

The offset compensation system also includes a feedback loop 66, which is intermittently connected around amplifier 44, between inverting input 60 and the amplifier output through a switch, C. When switch C is closed, the voltage offset appears at a low impedance at input 60. In order to store the voltage produced by the feedback loop on capacitor 64, switches A and B are provided to disconnect one end of the capacitor from summing node 14 and connect it to common ground 68.

Figure 5:
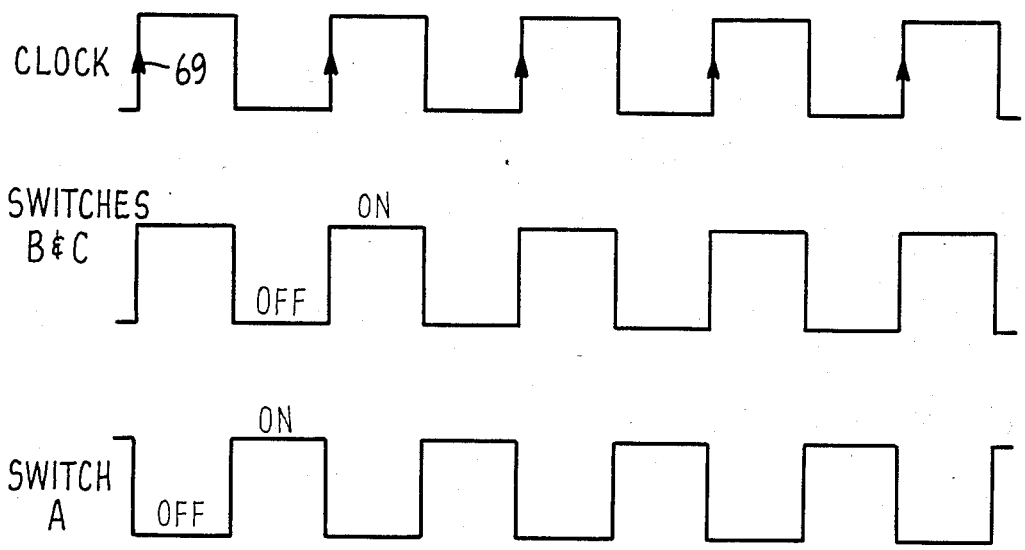
FIG. 5 is a timing diagram showing the control signals for operating the offset compensation system shown in FIG. 4.

The means for controlling the offset compensation system shown in FIG. 4 is clock 26, and FIG. 5 illustrates the control function. Bistable circuit 24 clocks at the leading edge of each clock cycle, as indicated by arrows 69. Each upward moving pulse represents one clock pulse. Just as the clock signal begins to go from low to high, switches B and C are off and switch A is on, meaning that the feedback loop around amplifier 44 is disconnected and capacitor 64 is connected to summing node 14. As soon as the clock pulse begins, switches B and C turn on and switch A turns off, connecting the feedback loop around amplifier 44 and connecting one terminal of capacitor 64 to ground. During this period, called the nulling period, the voltage offset $+V_{offset}$ of amplifier 44 appears at input 60. Since capacitor 64 is connected between input 60 and ground, the voltage $+V_{offset}$ is stored on the capacitor. During the last half of each clock cycle, called the measuring period, switches B and C again turn off and switch A turns on. With non-inverting input 62 tied to ground, the error at inverting input 60 is the negative value of the voltage offset $-V_{offset}$. Consequently, the signal being compared to the threshold level by comparator 44, when A is closed and B and C are open, is the voltage at summing node 14, ∫ $I_{diff}$, plus $+V_{offset}$ plus 31 $V_{offset}$. The voltage offset of comparator 44 is therefore cancelled, and the error it would otherwise produce in the threshold measurement is essentially eliminated.

Figure 6:
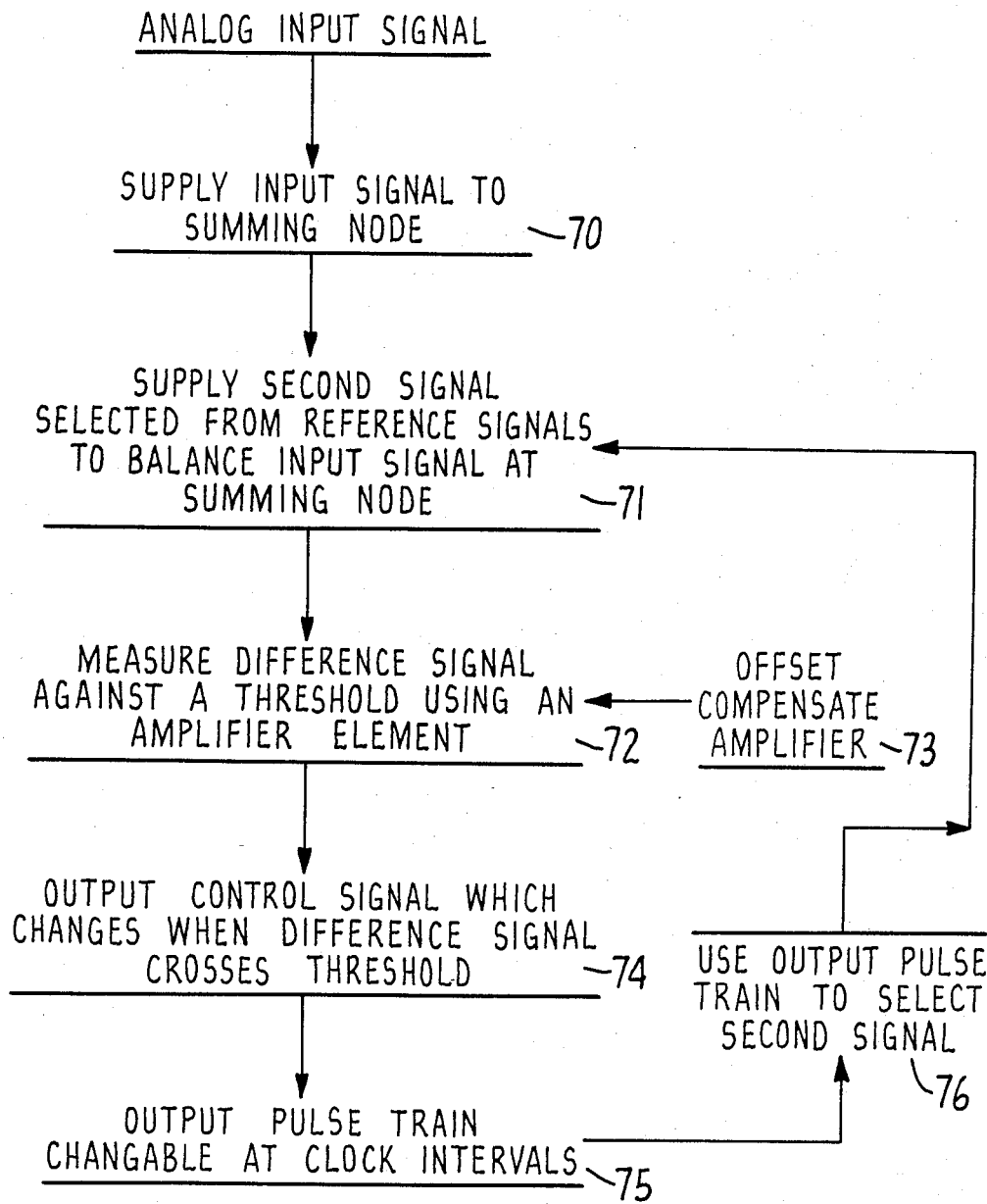
FIG. 6 is a diagram of the steps in the method of the present invention.

The operation of the embodiment of FIG. 4, as well as that of the other embodiments described herein, can be described in connection with the method of the present invention, the steps of which are illustrated in FIG. 6. The method is used to convert an analog input signal to an output pulse train, and begins with an analog signal such as a voltage, $V_{in}$. The first step 70 in the method is to supply the input signal to a summing node, such as node 14. The next step 71 is to supply a second signal to the summing node which is selected from at least two different reference signals having predetermined magnitudes. The method provides that the second signal will balance the input signal at the summing node, over time. Any instantaneous difference between the input signal and the second signal is referred to herein as a difference signal. The next step 72 is to measure the difference signal by integrating the difference signal and comparing the integrated difference signal against a threshold level. At least one amplifier element is used in the method of the present invention to accomplish the measuring step. Another step 73 is termed a compensating step, in which any voltage offset of the amplifier element employed in the measuring step is compensated for by transferring to a first storage element connected to one input of the amplifier element an offsetting voltage compensating for the offset. The next step 74, shown in FIG. 6, is a preferred method of transmitting the information that the integrated difference signal measured in measuring step 72 has crossed the threshold level, and includes outputting a first control signal which changes levels when the integrated difference signal crosses the threshold. In the embodiment of FIG. 4, the first control signal is output on line 22. The next step 75 is to produce an output signal, termed the first output signal, which is changeable at predetermined clock intervals in response to crossing of the threshold by the integrated difference signal produced in measuring step 72. The output pulse train, which is the output of bistable circuit 24, is then used in another step 76 to select the second signal which is supplied to summing node 14 through switches 32 and 34. In this step, one reference signal is supplied to the summing node when the output pulse train of step 75 is at its first level and another reference signal is supplied to the summing node when the output pulse train is at its second level, such that the average value of the reference signals over time balances the input signal at the summing node. The result is that the average level over time of the output signal from bistable circuit 24, the output pulse train, is proportional to the input signal.

The specific method for the embodiment of FIG. 4 includes several additional steps which are generally included in the description of the operation of the embodiment. For example, the compensating step includes interconnecting the inverting input and output of the amplifier element during an intermittent nulling period to form a negative feedback loop around amplifier element 44. The voltage offset thus appears at low impedance at the inverting input 60 during the nulling period. Simultaneously, during the nulling period, one terminal of capacitor 64 is disconnected from the summing node and connected to ground, such that the voltage offset is stored on capacitor 64. The method further includes alternating the nulling periods with measuring periods in which the feedback loop around the amplifier is disconnected and the capacitor is reconnected to the summing node. In this way, the voltage stored on capacitor 64 during the nulling period becomes the offsetting voltage which compensates for the voltage offset of the amplifier element as it measures the integrated difference signal appearing at summing node 14. As noted above, the nulling periods occur during a portion of each clock interval.

The output and signal curves shown in FIG. 3 are reproduced essentially unchanged for the circuit shown in FIG. 4. In other words, the circuit of FIG. 4 produces almost idealized results. Any voltage offset in comparator 44 would tend to move the threshold in curve 52 (FIG. 3) either up or down, with respect to $\int I_{diff}$. That, in turn, would produce errors in the comparator output, line 55, and Q, line 56. Since the offset compensation system of the embodiment of FIG. 4 compensates during each clock cycle, the offset error is continuously eliminated and the modulator is accurate over a wide dynamic range.

Figure 7:
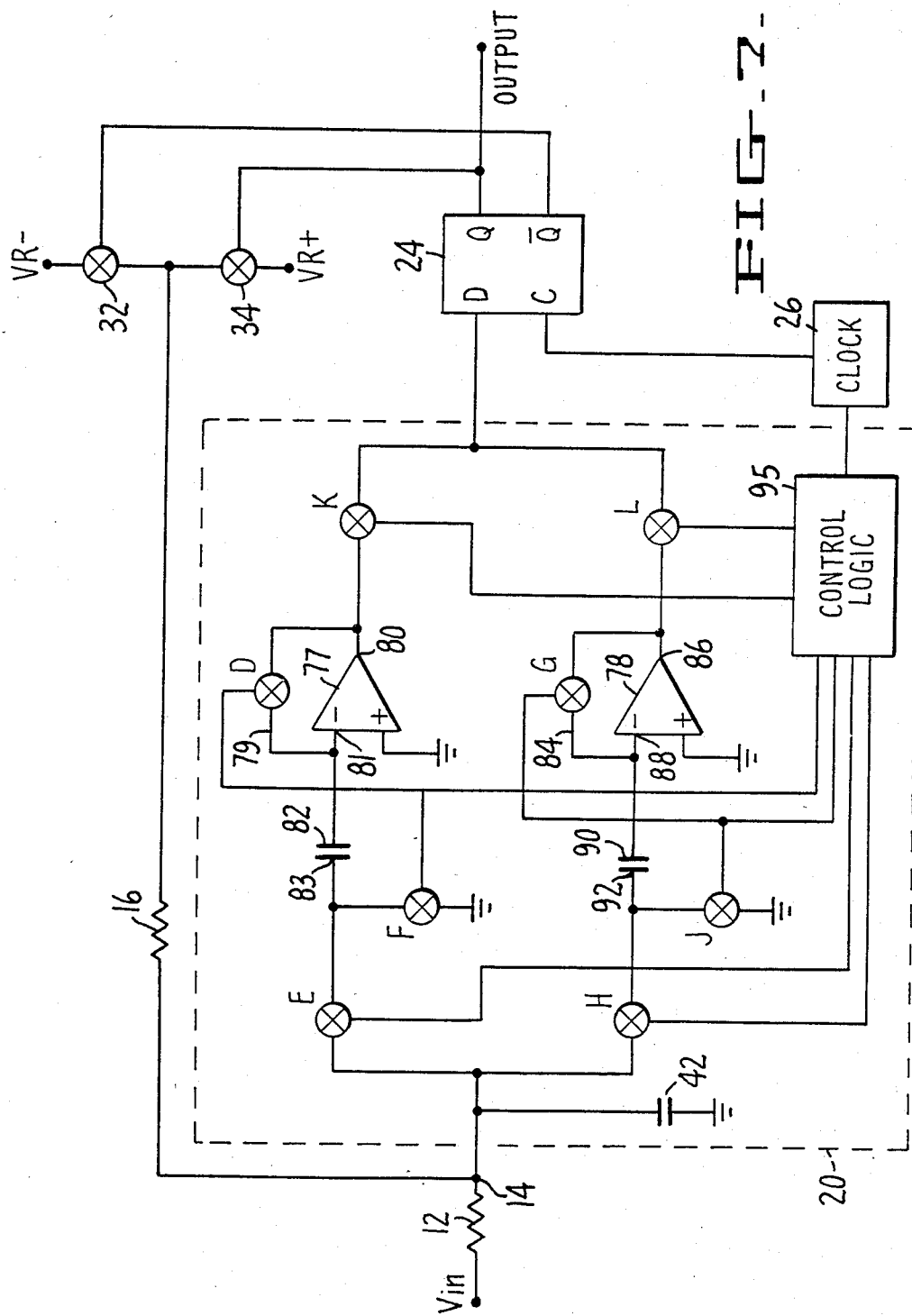
FIG. 7 is a schematic circuit diagram of another alternative embodiment of the modulator circuit of the present invention as shown in FIGS. 1 and 2.

Another embodiment of the modulator of the present invention is shown in FIG. 7. In this embodiment, measuring means 20 has first and second amplifier elements 77 and 78, respectively, which serve as comparators and are alternately connected between summing node 14 and bistable circuit 24. As in the previous embodiment, the embodiment of FIG. 7 includes compensating means for substantially eliminating any offset error which exists in amps 77 and 78.

First amp 77 is provided with a switchable feedback loop 79 connecting output 80 with inverting input 81 through switch D. A first storage element in the form of capacitor 82 is connected in the electrical path between summing node 14 and inverting input 81 through switch E. A path is provided between one terminal 83 of capacitor 82 and ground, through switch F. Second amplifier element 78 also includes a switchable feedback loop 84 connected between output 86 and inverting input 88 through switch G, and a storage element such as capacitor 90 is in the electrical path between inverting input 88 and summing node 14, through switch H. A path between one terminal 92 of capacitor 90 and ground is provided, through switch J.

The embodiment of FIG. 7 is designed to provide two parallel offset compensated comparator circuits for measuring the integrated difference signal at summing node 14. When switches E and K are closed, first amplifier element 77 supplies the first control signal to bistable circuit 24 and when switches H and L are closed, second amplifier element 78 supplies the first control signal to bistable circuit 24. By closing switches E, G, J and K and opening switches D, F, H and L, first amplifier element 77 is in a measuring mode supplying the control signal to bistable circuit 24, and second amplifier element 78 is in a nulling mode in which the voltage offset of amplifier element 78 is stored on capacitor 90. Storage of $V_{offset}$ on capacitors 82 and 90 is accomplished in exactly the same manner as with amplifier element 44 and capacitor 64 in the embodiment of FIG. 4. By reversing all the switches, i.e., closing switches D, F, H and L and opening switches E, G, H and K, amplifier 77 is in the nulling mode and amplifier 78 is in the measuring mode in which the integrated difference signal at summing node 14 is supplied to inverting input 88 through capacitor 90, compensating for the voltage offset of amplifier 78 and providing an error-free first control signal to the D input of bistable circuit 24.

One advantage of the embodiment shown in FIG. 7 over that shown in FIG. 4 is that one offset compensated amplifier is available at all times in its measuring mode. Furthermore, switching between measuring and nulling modes in the embodiment of FIG. 4 occurred at the clock frequency of clock 26. If the sampling frequency, as determined by the frequency of clock 26, is sufficiently high, the amplifier elements which serve as comparators will be unable to stabilize after each nulling period, and errors will be introduced. The embodiment of FIG. 7, which uses conventional control logic for operating switches D through L, represented by box 95, can be operated at a frequency different from clock 26. A conventional frequency divider can be used to reduce the frequency of the control operations, for example.

Figure 8:
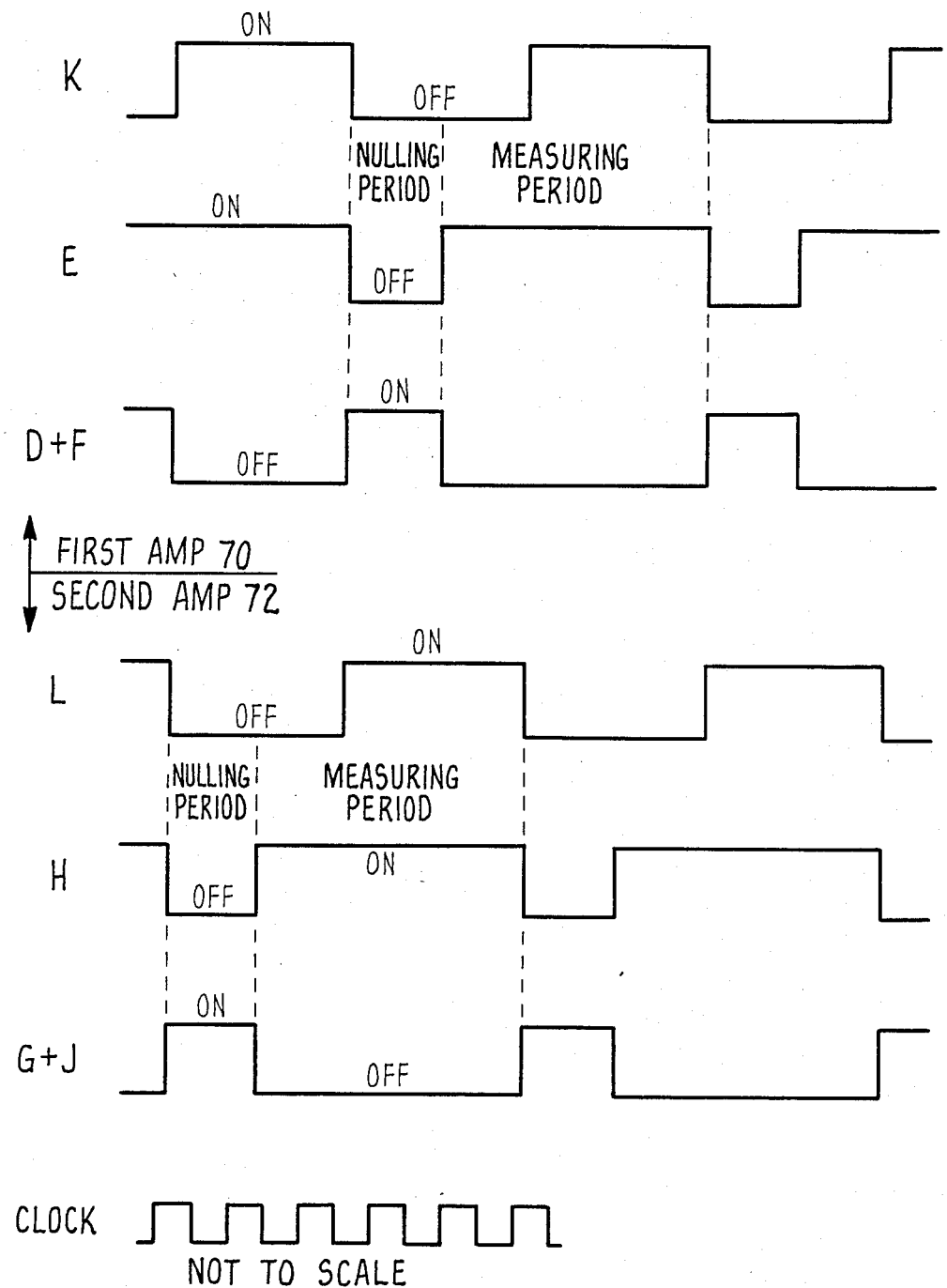
FIG. 8 is a timing diagram showing the control signals for operating the offset compensation system in the circuit of FIG. 7.

In order to insure that adequate time is provided for the amplifiers in the embodiment of FIG. 7 to stabilize after each nulling period, control logic 95, which serves as control means for operating switches D through L, extends the measuring period for each amplifier element to allow time for stabilization. FIG. 8 shows the timing diagram for the operation of switches D through L by control logic 95. Switches K and L, which connect the outputs of the first and second amplifier elements, respectively, to bistable circuit 24, are operated out of phase with one another. Switch K is on half the time, and off half the time and switch L being off when K is on, and vice versa. In addition to controlling the switches which connect the amplifiers to bistable circuit 24, control logic 95 also controls the switches which determine the nulling and measuring periods of amplifiers 77 and 78. Switches D, E and F serve to connect a feedback loop around amplifier 77 and connect the one terminal 83 of capacitor 82 to ground, in exactly the same manner as the embodiment of FIG. 4. Switches G, H and J perform the same function for amplifier 78. As can be seen from FIG. 8, the amplifier nulling and measuring periods of each amplifier element are not of the same duration. The nulling period for first amplifier 77, for example, begins when switch K turns off and ends before switch K again is turned on. Similarly, the nulling period of second amp 78 begins when switch L turns off and ends before switch L turns on again. Consequently, the nulling period of each amplifier is shorter than the measuring period by a predetermined interval. This is done to allow time for the amplifiers to stabilize before being connected to bistable circuit 24.

It should be noted that, in addition to allowing extra time for amplifier stabilization before connecting either the first or second amp to the bistable circuit, control logic 95 operates inherently slower than clock 26. As can be seen from FIG. 8, the clock signal, which is not drawn to scale, operates at a substantially higher frequency than any of the switches in FIG. 7. Control logic 95 preferably includes a frequency divider for this purpose. The embodiment shown in FIG. 7 can thus employ a relatively high frequency clock, for example 10 KHz, to provide frequent sampling and relatively high resolution, while nulling and offset compensating the amplifier elements at a low enough frequency to minimize errors due to slow amplifier response.

The embodiment of the method of the present invention performed by the embodiment of FIG. 7 includes an additional step in the measuring step, for switching between the first and second amplifier elements 77 and 78, respectively. The compensating step includes measuring with the first amplifier element and nulling the second amplifier element and then measuring with the second amplifier element and nulling the first amplifier element, in a continuous cycle, such that at least one of the offset compensated amplifier elements is connected to the summing node at all times. In the preferred embodiment of the method, the nulling periods and measuring periods are different, and preferably slower than the clock intervals. Further, the nulling periods are shorter than the measuring periods for each amplifier element, in accordance with the timing diagram of FIG. 8. The measuring period of one amplifier element is begun prior to ending the measuring period of the other amplifier element such that any errors due to slow comparator response of the first of the amplifier elements as it is initially switched from nulling to measuring is eliminated.

Operation of the embodiment of FIG. 7 will produce the results illustrated in FIG. 3. Assuming $V_{in}$ is as shown on line 50, the integrated difference signal appearing at summing node 14 will be that shown on line 52. Both the first control signal 55 and Q output 56 will be unaffected by the intermittent operation and cyclical nulling and measuring periods of amplifiers 77 and 78. This is because the function performed by measuring means 20 in the embodiments of FIGS. 2, 4 and 6 are exactly the same. The embodiment of FIG. 7 provides greater accuracy at higher clock frequencies, but is otherwise functionally identical to the embodiment of FIG. 4.

Figure 9:
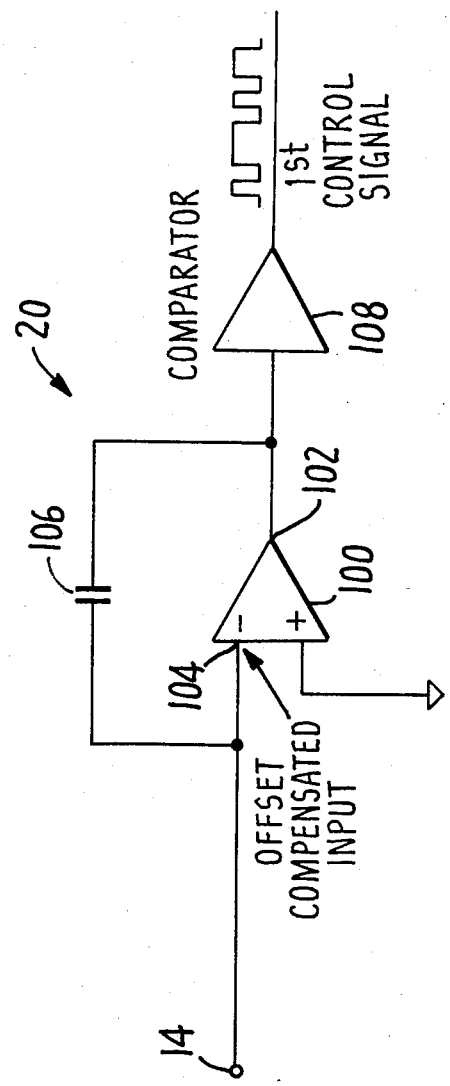
FIG. 9 is an alternative embodiment of the measuring circuit shown in FIGS. 1 and 2.

Another embodiment of a generalized measureing circuit 20 is shown in FIG. 9 and includes an active integrator, incorporating highgain operational amplifier 100, connected in a negative feedback loop between its output 102 and inverting input 104. A capacitor 106 in the feedback loop serves as a storage element. The voltage which appears at amplifier output 102 represents the integrated difference signal at summing node 14. A conventional comparator 108 compares the voltage at point 102 against a threshold level, and outputs a first control signal which is high when the integrated difference signal is above the threshold and low when the integrated difference signal is below the threshold. In this configuration, the voltage at summing node 14 remains a virtual earth, with the difference signal appearing as a voltage cross capacitor 106. Any voltage offset which might be present between the inputs of amplifier 100 must be compensated for in order to eliminate measurement errors. An actual implementation of an offset compensation system in accordance with the present invention is shown in FIG. 10.

Figure 10:
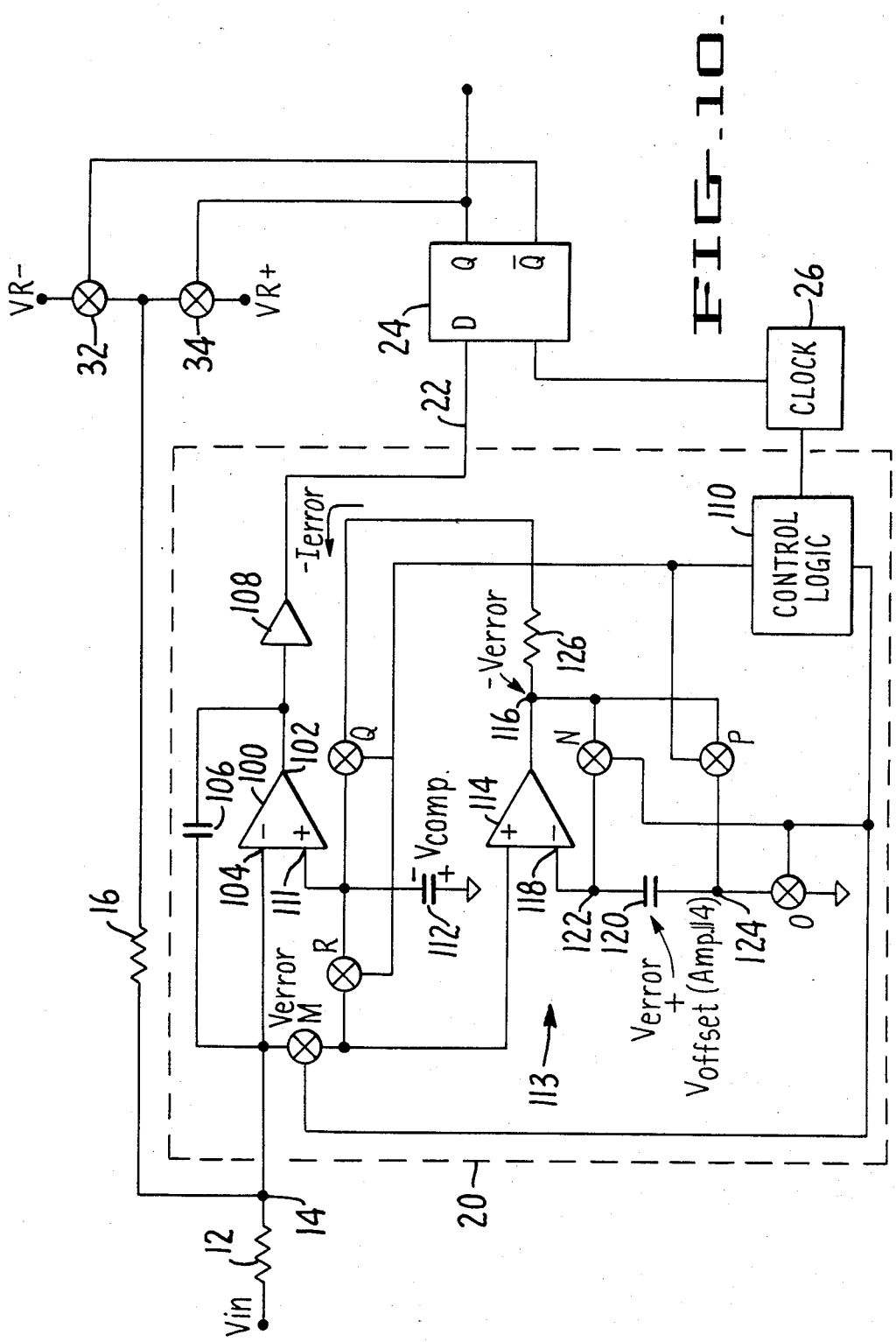
FIG. 10 is a schematic circuit diagram showing another alternative embodiment as in FIGS. 1 and 9 of the modulator with offset compensation according to the present invention.

Referring to FIG. 10, and using the reference numbers of FIG. 9 for identical elements, the illustrated embodiment of measuring circuit 20 includes control logic 110 for operating a series of switches which serve to transfer in steps the entire voltage offset appearing between the inputs of amplifier 100 to a first storage element, such as capacitor 112. Unlike the previous embodiments, the first storage element on which the offsetting voltage is stored is not in the electrical path between the summing node and inverting input of the amplifier, but is instead connected between the non-inverting input 111 and ground. If capacitor 112 is charged to $V_{offset}$ of amplifier 100, input 104 of amp 100 will be a zero or virtual earth. The offset compensation means of the embodiment of FIG. 10 determines, by the steps set forth below, if any voltage exists between inverting input 104 and ground, termed herein the error voltage, $V_{error}$, and adds a corresponding offsetting voltage to capacitor 112 until $V_{error}$ is eliminated.

Figure 11:
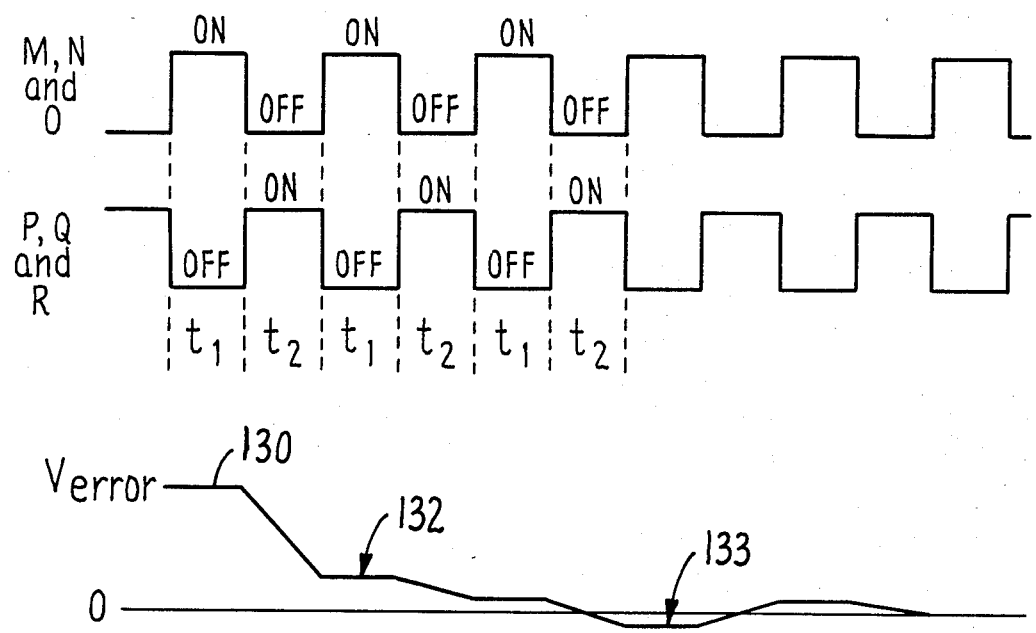
FIG. 11 is a timing diagram showing the control signals for operating the offset compensation system of the circuit shown in FIG. 10.

The system for determining the error voltage at input 104 of amplifier 100 and for transferring it to capacitor 112 includes a switch M for intermittently connecting input 104 to a voltage storage means, indicated generally at 113. Switch M, as well as the other switches in the system, N through R, are all controlled by control logic 110, which serves as part of the offset compensation means of this embodiment. FIG. 11 shows the timing diagram for operating switches M through R, as controlled by control logic 110. switches M, N and O are closed when switches P, Q and R are open during what is termed a transfer period, $t_1$, and switches P, Q and R are closed when M, N and O are open, during what is termed a charging period, $t_2$. During the transfer period the error voltage appearing at input 104 is supplied to the non-inverting input of a second amplifier element 114, which forms a part of the voltage storage means 113. Simultaneously, switch N is closed, to intermittently connect second amplifier output 116 with inverting input 118 to form a negative feedback loop.

Thus, amplifier 114, which is configured as a unity-gain amplifier, transmits $V_{error}$ from 104, together with any internal voltage offset from amplifier 114, to its output 116. Because of the feedback connection through switch N, and the closure of switch O, the error voltage, together with the voltage offset of amplifier 114, is temporarily stored on capacitor 120 during $t_1$. Capacitor 120, which serves as a temporary storage element, has a first terminal 122 connected to output 116 and inverting input 118 of amplifier 114, and a second terminal 124 connected to the common ground through switch O. When control logic 110 opens switches M, N and O and closes switches P, Q and R during $t_2$, second terminal 124 of capacitor 120 is connected to output 116 of amplifier 114. Storage capacitor 120 is then in a feedback loop between inverting input 118 and output 116 of amplifier 114. The voltage on capacitor 120, $V_{error} + V_{offset}$ (Amp 114) is now supplied to the inverting input 118 of amplifier 114, where the $V_{offset}$ (Amp 114) component cancels the internal voltage offset of the amplifier. The output 116 is thus at $-V_{error}$ relative to its own positive input. With the voltage on first capacitor 112, $V_{comp}$, supplied to the non-inverting input of amplifier 114 through switch R, the output at 116 is $V_{comp} - V_{error}$. A current $-I_{error}$ is supplied to capacitor 112 through impedance 126 and corrects $V_{comp}$ for differences between $V_{comp}$ and the voltage offset of amplifier 100.

The method of the present invention performed by the embodiment of FIG. 10 includes a measuring step in which the integration of the difference signal is accomplished using active circuit elements, including amplifier 100. The integrated difference signal is thereby produced at the output of amplifier 100, which is then compared against a threshold level by a separate comparator 108. In the compensating step of the method, the voltage at the inverting input of amplifier 100 is connected intermittently, during a transfer period, to the non-inverting input of second amplifier 114. Simultaneously, the output of amplifier 114 is connected to capacitor 120 such that the difference voltage from inverting input 104 is stored temporarily on capacitor 120. During a subsequent charging period, a current is supplied to capacitor 112 through an impedance such as resistor 126. The current is proportional to the difference between the voltage on capacitor 112 and the voltage offset of amplifier 100. The method includes alternately repeating the transfer and charging periods such that the difference between the voltage on capacitor 112 and the voltage offset of the amplifier element is reduced to a minimum. The transfer and charging periods are preferably longer than the intervals of clock 26. The method allows amplifier 100 to be continuously integrating the difference signal at summing node 14, while being fulling offset compensated.

Line 130 in FIG. 11 shows the variations in $V_{error}$ during initial start-up of the modulator of FIG. 10. During the first transfer period $t_1$, the voltage on capacitor 112, $V_{comp}$, is zero and the full voltage offset of amplifier 100 appears as $V_{error}$. $V_{error}$ is transferred to amplifier 114 through switch M, where the voltage is stored on capacitor 120 together with $V_{offset\,(Amp\,114)}$. During the charging period $t_2$, $V_{comp} - V_{error}$ appears at output 116, and since $V_{comp}$ is zero, a current $-I_{error}$ is supplied to capacitor 112 through impedance 126 and switch Q. The values of capacitor 112 and impedance 126 are chosen to produce a current $-I_{error}$ which will not excessively change the voltage on capacitor 112 and overcompensate for the voltage offset of amplifier 100, during any given charging period $t_2$. Current $-I_{error}$ will charge capacitor 112, which is supplied to the non-inverting input of amplifier 100, to the opposite polarity of $V_{error}$, which is at the inverting input. During the next transfer period, $t_1$, $V_{error}$ will be reduced, as shown at 132 of FIG. 11. $V_{error}$ will again be stored on capacitor 120 with $V_{offset\,(Amp\,114)}$. During the period $t_2$, $V_{offset}$ (Amp 114) is cancelled and the output 116 of amplifier 114 is $V_{comp} - V_{error}$. The voltage accross impedance 126 is $-V_{error}$ and $-I_{error}$ flows to capacitor 112, further increasing the magnitude of $V_{comp}$. During subsequent cycles, $V_{comp}$ approaches the voltage offset of amplifier 100, and $V_{error}$ is reduced to approximately zero. If, during a period $t_2$, $V_{comp}$ exceeds the offset voltage, the system will produce a negative $V_{error}$ during the next $t_1$, as shown at 133. This condition will occur when the magnitude of $-V_{error}$ at 116 is sufficiently large to produce a current $-I_{error}$ during a charging period that overcharges capacitor 112 above the offset voltage of amplifier 100. As $V_{comp}$ on capacitor 112 gets closer to the voltage offset, $-V_{error}$ gets smaller, as does $-I_{error}$, and the slope of the segments of line 130 during periods $t_2$ tend to become smaller. Eventually $V_{error}$ will approach zero.

The operation of the embodiment of FIG. 10 can be described with respect to the traces shown in FIG. 3. If the input voltage $V_{in}$ is as shown on line 50, an integrated difference signal appears across capacitor 106 as shown on line 52. The signal represented by line 52 is compared against a threshold by comparator 108, which outputs a first control signal on line 22 to bistable circuit 24. The output Q from the embodiment of FIG. 10, assuming $V_{in}$ as shown in FIG. 3, will be that shown on line 56 of FIG. 3. As in the previous embodiments, the Q and $\overline{Q}$ outputs of bistable circuit 24 control switches 32 and 34, which connect reference voltages to summing node 14 through resistance 16. The current supply to summing node 14 through resistance 12 from $V_{in}$ is balanced by the average current supplied to summing node 14 from the reference sources through switches 32 and 34. Consequently, the average level of Q, representing the overall pulse modulated output of the circuit, is exactly proportional to $V_{in}$.

The embodiments of the invention described above represent pulse modulators and modulation methods for producing an output pulse train having an average level proportional to an analog input signal. If, for example, the input signal $V_{in}$ is zero, Q of bistable circuit 24 will be high exactly the same amount of time it is low, producing an average level exactly midway between the high and low levels of Q. If $V_{in}$ is a positive voltage, the positive current into summing node 14 must be balanced by a larger negative current supplied to summing node 14 by the negative reference voltage source VR−. Consequently, switch 32 will be closed and switch 34 opened a greater amount of time than will switch 32 be open and switch 34 closed. The output Q will be low more than it is high by an amount proportional to the magnitude of $V_{in}$. If $V_{in}$ is negative, the positive reference current supplied to summing node 14 through switch 34 will predominate, and Q will be high more than it is low.

Q can remain high or low for however long it takes the reference signals to balance the input signal at the summing node. Input voltage measurements therefore can be made over the widest possible range. The input current to summing node 14 through resistance 12 can be accurately measured up to a value which exactly equals the reference current $I_2$ supplied by either reference voltage source through resistance 16. Because all the embodiments described above for measuring circuit 20 include an active circuit element which has virtually no offset error, the modulator is highly accurate even for low values of $V_{in}$, which means a wide dynamic range. The modulator of the present invention can be readily fabricated using conventional CMOS circuitry, without the need for costly calibration or the use of high-cost components.

What is claimed is:

1. A modulator for converting an input signal to an output pulse train which varies between two levels and which has an average level over time proportional to the input signal comprising:

means for supplying said input signal to a summing node;

switch means for supplying a second signal to said summing node selected from at least two different reference signals, wherein the difference at any time between said input signal and said second signal is a difference signal;

measuring means for integrating the difference signal at said summing node and for determining when the integrated difference signal reaches a threshold level, said measuring means including an amplifier element having inverting and non-inverting inputs and an output, with said non-inverting input coupled to a common ground and said inverting input coupled to said summing node and offset compensation means for substantially eliminating any offset error resulting from a voltage offset existing between said amplifier inputs, said compensation means including a first storage element having one terminal coupled to said inverting input and transfer means for transferring an offsetting voltage to said first storage element to compensate for said voltage offset;

a clock for producing clock pulses at predetermined clock intervals; and a bistable circuit coupled to said amplifier element output and responsive to said clock pulses and which produces a first output signal changeable at each said clock pulse between first and second levels whenever said integrated difference signal has crossed said threshold level during a clock interval, said switch means being responsive to said bistable circuit such that one of said reference signals is supplied to said summing node when said first output signal is at said first level and another reference signal is supplied to said summing node when said first output signal is at said second level, wherein the average value of the reference signals over time balances said input signal at said summing node and the average level ofer time of said first output signal is proportional to said input signal and wherein said measuring means includes a second storage element coupled between said summing node and said common ground for providing part of a passive integration means for integrating said difference signal, with the voltage on said summing node being said integrated difference signal and said transfer means includes control means for alternately switching said amplifier element between a nulling mode wherein a second terminal of said first storage element is coupled to said common ground and a feedback path is provided between said inverting input and said output of said amplifier element such that any voltage offset is stored in said first storage element and a measuring mode wherein said second terminal of said first storage element is coupled to said summing node such that said stored voltage offset is in series with said inverting input.

2. A modulator as in claim 1 in which said second signal is selected from two said reference signals which are substantially equal in magnitude and opposite in polarity.

3. A modulator as in claim 1 wherein said mode switch means is synchronized with said clock pulses such that said measuring means is in said nulling mode during a portion of each of said clock intervals and switches to said measuring mode when said first output signal from said bistable circuit is changeable in response to said measuring means.

4. A modulator for converting an input signal to an output pulse train which varies between two levels and which has an average level over time proportional to the input signal comprising:

means for supplying said input signal to a summing node;

switch means for supplying a second signal to said summing node selected from at least two different reference signals wherein the difference at any time between said input signal and said second signal is a difference signal;

measuring means for integrating the difference signal at said summing node and for determining when the integrated difference signal reaches a threshold level, said measuring means including first and second amplifier elements, with each of said elements having a pair of inputs and an output, and offset compensation means for substantially eliminating any offset error resulting from a voltage offset existing between said inputs of said amplifier elements, said compensation means including a first storage element associated with each of said amplifier elements having one terminal coupled to a first input of said associated amplifier element, a transfer means for transferring an offsetting voltage to said first storage element to compensate for said voltage offsets;

a clock for producing clock pulses at predetermined clock intervals; and a bistable circuit responsive to said measuring means and said clock and which produces a first output signal changeable at each said clock pulse between first and second levels whenever said integrated difference signal has crossed said threshold during a clock interval, said switch means being responsive to said bistable circuit such that one of said reference signals is supplied to said summing node when said first output signal is at said first level and another reference signal is supplied to said summing node when said output signal is at said second level, wherein the average value of the reference signals over time balance said input signal at said summing node and the average level over time of said first output signal is proportional to said input signal and wherein said measuring means includes a second storage element coupled between said summing node and a common ground for providing part of a passive integration means for integrating said difference signal, with the voltage on said summing node being said integrated difference signal and said transfer means includes control means for alternately switching said amplifier elements between a nulling mode wherein said first storage element is charged with said offset voltage of said associated amplifier element and a measuring mode wherein said first storage element is coupled to said summing node with one of said amplifier elements being in said measuring mode when said remaining amplifier element is in said nulling mode.

5. A modulator as in claim 4 in which said first inputs of said amplifier elements are inverting and non-inverting inputs and, in said nulling mode, said transfer means causes a feedback path to be coupled between said inverting input and said output of said associated amplifier element such that a voltage offset is produced at said inverting input which is stored on said first storage element.

6. A modulator as in claim 5 wherein said control means causes said amplifier elements to be in said nulling mode for a shorter time period than in said measuring mode, with the nulling period of one amplifier element ending a predetermined interval before the commencement of the subsequent measuring period of the other amplifier element.

7. A modulator for converting an input signal to an output pulse train which varies between two levels and which has an average level over time proportional to the input signal comprising:
   means for supplying said input signal to a summing node;
   switch means for supplying a second signal to said summing node selected from at least two different reference signals, wherein the difference at any time between said input signal and said second signal is a difference signal;
   measuring means for integrating the difference signal at said summing node and for determining when the integrated difference signal reaches a threshold level, said measuring means including a first amplifier element having inverting and non-inverting inputs and an output, a comparator element having an input coupled to said output of said first amplifier element and offset compensation means for substantially eliminating any offset error resulting from a voltage offset existing between said inputs of said first amplifier element, said compensation means including a first storage element coupled between said non-inverting input and a common ground to compensate for said voltage offset;
   a clock for producing clock pulses at predetermined clock intervals; and
   a bistable circuit responsive to an output of said comparator element and to said clock and which produces a first output signal changeable at each said clock pulse between first and second levels whenever said integrated difference signal has crossed said threshold level during a clock interval, said switch means being responsive to said bistable circuit such that one of said reference signals is supplied to said summing node when said first output signal is at said first level and another reference signal is supplied to said summing node when said first output signal is at said second level, wherein the average value of the reference signals over time balances said input signal at said summing node and the average level over time of said first output signal is proportional to said input signal and wherein said inverting input of said amplifier is coupled to said summing node and said non-inverting input is coupled to said first storage element and a second storage element is coupled between said inverting input and said output of said amplifier means, with said comparator element determining when said integrated difference signal on said second storage element reaches a threshold level and said transfer means further include a second amplifier element having inverting and non-inverting inputs and an output and a third storage element and control means for alternately switching said second amplifier element between a transfer mode wherein said inverting and non-inverting inputs of said first and second amplifier elements, respectively, are coupled together, said third storage element is coupled between said inverting input of said second amplifier and said common ground, and a feedback path is provided between said inverting input and said output of said second amplifier element so as to store said offset voltage on said third storage element and a charging mode wherein said non-inverting inputs of said first and second amplifier elements are coupled together, said third storage element is coupled between said inverting input and said output of said second amplifier element and said output of said second amplifier element is coupled to said non-inverting input of said first amplifier element through a charging impedance so as to charge said first storage element, thereby compensating for said offset voltage.

8. A method of converting an input signal to an output pulse train which varies between two levels and which has an average level over time proportional to the input signal comprising the steps of:
   supplying said input signal to a summing node;
   supplying a second signal selected from at least two different reference signals having predetermined magnitudes, wherein the difference at any time between said input signal and said second signal is a difference signal;
   measuring said difference signal by integrating the difference signal and comparing the integrated difference signal against a threshold level, said measuring step including the use of at least one amplifier element and including the step of compensating for any voltage offset between inverting and non-inverting inputs of said amplifier element by transferring to a first storage element having a first terminal coupled to said non-inverting input an offsetting voltage which compensates for the voltage offset of said amplifier element such that the measurement of said difference signal is highly accurate;
   outputting a first output signal changeable at predetermined clock intervals between first and second levels whenever said integrated difference signal crosses said threshold level in said measuring step during a clock interval, said second signal being selected in response to said first output signal such that one said reference signal is supplied to said summing node when said first output signal is at said first level and another said reference signal is supplied to said summing node when said first output signal is at said second level such that the average value of the reference signals over time balances said input signal at said summing node and the average level over time of said first output signal is proportional to said input signal; and
   with said measuring step further including the step of integrating said difference signal utilizing a second storage element coupled between said summing node and a common ground and with said compensating step including the step of alternately switching said amplifier element between a nulling mode, wherein a second terminal of said first storage element is coupled to said common ground and a feedback path is provided between said inverting input and said output of said amplifier element such that any voltage offset is stored on said first storage element and a measuring mode wherein said second terminal of said first storage element is coupled to said summing node such that said stored voltage offset is in series with said inverting input.

9. A method as in claim 8 in which the reference signals supplied in said step of supplying a second signal to said summing node are substantially equal in magnitude and opposite in polarity.

10. A method as in claim 8 in which said amplifier element is switched to said nulling mode during a portion of each said clock interval.

11. A method of converting an input signal to an output pulse train which varies between two levels and which has an average level over time proportional to the input signal comprising the steps of:
supplying said input signal to a summing node;
supplying a second signal selected from at least two different reference signals having predetermined magnitudes, wherein the difference at any time between said input signal and said second signal is a difference signal;
measuring said difference signal by integrating the difference signal and comparing the integrated difference signal against a threshold level, said measuring step including the use of first and second amplifier elements, with each of said elements having a pair of inputs and an output and including the step of compensating for any voltage offset between said inputs of said amplifier elements by transferring to a first storage element associated with each said amplifier element an offsetting voltage which compensates for the voltage offset of said associated amplifier element such that the measurement of said difference signal is highly accurate;
outputting a first output signal changeable at predetermined clock intervals between first and second levels whenever said integrated difference signal crosses said threshold level in said measuring step during a clock interval, said second signal being selected in response to said first output signal such that one said reference signal is supplied to said summing node when said first output signal is at said first level and another said reference signal is supplied to said summing node when said first output signal is at said second level such that the average value of the reference signals over time balances said input signal at said summing node and the average level over time of said first output signal is proportional to said input signal; and
with said measuring step further including the step of integrating said difference signal utilizing a second storage element coupled between said summing node and a common ground and with said compensating step including the step of alternately switching said amplifier elements between a nulling mode, wherein a second terminal of said first storage element is coupled to said common ground and a feedback path is provided between said inverting input and said output of said associated amplifier element such that any voltage offset of said associated amplifier element is stored in said first storage element and a measuring mode wherein said second terminal of said first storage element is coupled to said summing node such that said stored voltage offset is in series with said inverting input, with one of said amplifier elements being in said measuring mode when said remaining amplifier element is in said nulling mode.

12. A method as in claim 11 in which the time periods in which said amplifier elements are in said nulling mode and in said measuring mode are different from said clock intervals.

13. A method as in claim 11 in which said nulling mode time period is shorter than said measuring mode time period.

14. A method as in claim 13 in which said measuring mode time period of one said amplifier element overlaps the subsequent measuring mode time period of the other said amplifier element.

15. A method of converting an input signal to an output pulse train which varies between two levels and which has an average level over time proportional to the input signal comprising the steps of:
supplying said input signal to a summing node;
supplying a second signal selected from at least two different reference signals having predetermined magnitudes, wherein the difference at any time between said input signal and said second signal is a difference signal;
measuring said difference signal by integrating the difference signal and comparing the integrated difference signal against a threshold level, said measuring step including the use of a first amplifier element having inverting and non-inverting inputs, with said inverting input coupled to said summing node and a comparator element having an input coupled to an output of said first amplifier element and further including the step of compensating for any voltage offset between said inputs of said first amplifier element utilizing a first storage element coupled between said non-inverting input and a common ground to compensate for said voltage offset;
outputting a first output signal changeable at predetermined clock intervals between first and second levels whenever said integrated difference signal crosses said threshold level in said measuring step during a clock interval, said second signal being selected in response to said first output signal such that one said reference signal is supplied to said summing node when said first output signal is at said first level and another said reference signal is supplied to said summing node when said first output signal is at said second level such that the average value of the reference signal over time balances said input signal at said summing node and the average level over time of said first output signal is proportional to said input signal; and
with said measuring step further including the step of integrating said difference signal utilizing a second storage element coupled between said inverting input and said output of said first amplifier element and with said compensating step including the use of a second amplifier element having inverting and non-inverting inputs and an output and a third storage element and alternately switching said second amplifier element between a transfer mode wherein said inverting and non-inverting inputs of said first and second amplifier elements, respectively, are coupled together, said third storage element is coupled between said inverting input of said second amplifier element and said common ground, and a feedback path is coupled between said inverting input and said output of said second amplifier element so as to store said offset voltage on said third storage element and a charging mode wherein said non-inverting inputs of said first and second amplifier elements are coupled together, said third storage element is coupled between said inverting input and said output of said second amplifier element and the output of said second amplifier element is coupled to said non-inverting input of said first amplifier element through a charging impedence so as to charge said first storage element, thereby compensating for said offset voltage.

16. A method as in claim 15 in which said second amplifier element is switched between said transfer and said charging mode at intervals which are longer than said clock intervals.

* * * * *